US010020422B1

(12) United States Patent
Oyer

(10) Patent No.: US 10,020,422 B1
(45) Date of Patent: Jul. 10, 2018

(54) MESA SHAPED MICRO LIGHT EMITTING DIODE WITH BOTTOM N-CONTACT

(71) Applicant: Oculus VR, LLC, Menlo Park, CA (US)

(72) Inventor: Celine Claire Oyer, Cork (IE)

(73) Assignee: Oculus VR, LLC, Menlo Park, CA (US)

( * ) Notice: Subject to any disclaimer, the term of this patent is extended or adjusted under 35 U.S.C. 154(b) by 0 days.

(21) Appl. No.: 15/721,417

(22) Filed: Sep. 29, 2017

(51) Int. Cl.
| | |
|---|---|
| *H01L 33/20* | (2010.01) |
| *H01L 33/10* | (2010.01) |
| *H01L 33/00* | (2010.01) |
| *H01L 33/06* | (2010.01) |
| *H01L 33/24* | (2010.01) |
| *H01L 33/42* | (2010.01) |
| *H01L 33/62* | (2010.01) |
| *H01L 25/075* | (2006.01) |
| *H01L 25/16* | (2006.01) |
| *H01L 33/32* | (2010.01) |
| *H01L 33/58* | (2010.01) |

(52) U.S. Cl.
CPC .......... *H01L 33/10* (2013.01); *H01L 25/0753* (2013.01); *H01L 25/167* (2013.01); *H01L 33/007* (2013.01); *H01L 33/0079* (2013.01); *H01L 33/06* (2013.01); *H01L 33/20* (2013.01); *H01L 33/24* (2013.01); *H01L 33/32* (2013.01); *H01L 33/42* (2013.01); *H01L 33/58* (2013.01); *H01L 33/62* (2013.01); *H01L 2933/0016* (2013.01); *H01L 2933/0066* (2013.01)

(58) Field of Classification Search
CPC ......... H01L 29/66007; H01L 29/66083; H01L 29/66204
See application file for complete search history.

(56) References Cited

U.S. PATENT DOCUMENTS

| | | | |
|---|---|---|---|
| 7,518,149 B2 | 4/2009 | Maaskant et al. | |
| 2013/0020589 A1* | 1/2013 | Yu | ........................ H01L 33/0079 257/88 |
| 2015/0372192 A1* | 12/2015 | Epler | ...................... H01L 33/16 257/76 |

* cited by examiner

*Primary Examiner* — Cheung Lee
(74) *Attorney, Agent, or Firm* — Fenwick & West LLP

(57) ABSTRACT

A light emitting diode (LED) with a first electrical contact at the top of the LED and a second electrical contact at the bottom of the LED. Layers of materials are formed on a substrate. The layers of materials include a first semiconductor layer, a second semiconductor layer, and a light emitting layer between the first and second semiconductor layers for producing light responsive to passing current through the light emitting layer. The formed layers of material are shaped into at least one semiconductor structure. A first electrical contact is formed on a top of the semiconductor structure, and a second electrical contact is formed at a bottom of the semiconductor structure. The second electrical contact is at least partially transparent.

20 Claims, 4 Drawing Sheets

MESA SHAPED MICRO LIGHT EMITTING DIODE WITH BOTTOM N-CONTACT

BACKGROUND

This disclosure relates to a mesa shaped micro light emitting diode (LED) with the N-contact pad at the base of a mesa.

LEDs convert electrical energy into optical energy. In semiconductor LEDs, light is usually generated through recombination of electrons, originating from an n-type doped semiconductor layer, and holes originating from a p-type doped semiconductor layer. As used herein, the term "light" includes not just visible light, but also electromagnetic radiation having a wavelength outside that of the visible range, including infrared and ultraviolet radiation.

Prior bottom-emitting micro-LEDs ("μLEDs") have a p-contact and an n-contact both formed on the top side of the μLED. In some cases, the p-contact is formed on top of a mesa structure that includes a p-type layer, a quantum well, and an n-type layer. The n-type layer extends beyond the mesa structure, and the n-contact is formed on top of this extended portion of the n-type layer. A transistor layer, such as a thin film transistor (TFT) layer, connects to the p-contact and the n-contact. The transistors apply a voltage difference between the n-contact and the p-contact which causes current to flow between the contacts and light to emit from the quantum well. The light is emitted through the bottom side of the μLED, opposite the electrical contacts and the transistor layer.

In this configuration, light emits only from the mesa structure, which is underneath the p-contact. No light emits from the area underneath the n-contact. It would be desirable to increase the amount of light extracted relative to the area of the μLED, and to increase the density of μLEDs in arrangements with multiple μLED devices. In addition, it is desirable to simplify the process of producing μLEDs to reduce cost and time of production.

SUMMARY

Embodiments relate to a light emitting diode (LED) with a first electrical contact at the top of the LED and a second electrical contact at the bottom of the LED. Layers of materials are formed on a substrate. The layers of materials include a first semiconductor layer, a second semiconductor layer, and a light emitting layer between the first and second semiconductor layers for producing light responsive to passing current through the light emitting layer. The formed layers of material are shaped into at least one semiconductor structure where a first electrical contact is formed on a top of the semiconductor structure and a second electrical contact is formed at a bottom of the semiconductor structure. The second electrical contact is at least partially transparent.

In some embodiments, the second electrical contact is a transparent conductive oxide material. The second electrical contact may be formed by depositing the transparent conductive oxide material as a thin film on the bottom of the semiconductor structure.

In some embodiments, the semiconductor structure is aligned to a first circuitry substrate and the first electrical contact is connected to a contact pad on the first circuitry substrate. The semiconductor structure is also aligned to a second circuitry substrate and is connected via the second electrical contact to another contact pad on the second circuitry substrate. The second circuitry substrate may be transparent.

In some embodiments, the formed layers of material is shaped by etching the layers of materials into a mesa. The first electrical contact may be formed on a top of the mesa. In some embodiments, the layers of material are etched through during the shaping of the formed layers to individuate the at least one semiconductor structure.

The first semiconductor layer may have a first electrical resistivity along a direction of height and a second electrical resistivity in a direction perpendicular to the direction of height. The first electrical resistivity lower than the second electrical resistivity.

Embodiments also relate to LED including a semiconductor structure having a first semiconductor layer, a second semiconductor layer, and a light emitting layer between the first semiconductor layer and the second semiconductor layer for producing light responsive to passing current through the light emitting layer. The LED also includes a first electrical contact on a top surface of the semiconductor structure, and a second electrical contact on a bottom surface of the semiconductor structure. The second electrical contact may be at least partially transparent. The bottom of the semiconductor structure may have a circular shape.

In other aspects, an LED assembly wafer is disclosed herein. The LED assembly wafer includes a plurality of the LEDs described above, along with a first substrate having first contacts pads each connected to a respective one of the first electrical contacts of the plurality of LEDs, and a second substrate having second contact pads each connected to a respective one of the second electrical contacts of the plurality of LEDs.

DETAILED DESCRIPTION

Embodiments relate to a mesa-shaped bottom-emitting micro LED, or "μLED," that has an n-contact at the bottom of the μLED structure. Relative to prior μLEDs, the disclosed μLED structure increases the amount of light extracted relative to size of the μLED, and increases the density of μLEDs in arrangements with multiple μLED devices. These benefits are achieved by moving the n-contact from the side of a light-emitting semiconductor structure, where it is typically placed on bottom-emitting μLEDs, to the bottom of the semiconductor structure, so that layers of semiconductor material and a quantum well are sandwiched between a p-contact on the top of the semiconductor structure and an n-contact on the bottom of the semiconductor structure. Embodiments also relate to a process of producing these μLEDs that reduces cost and time of production compared to prior μLED production methods.

Figure 1:
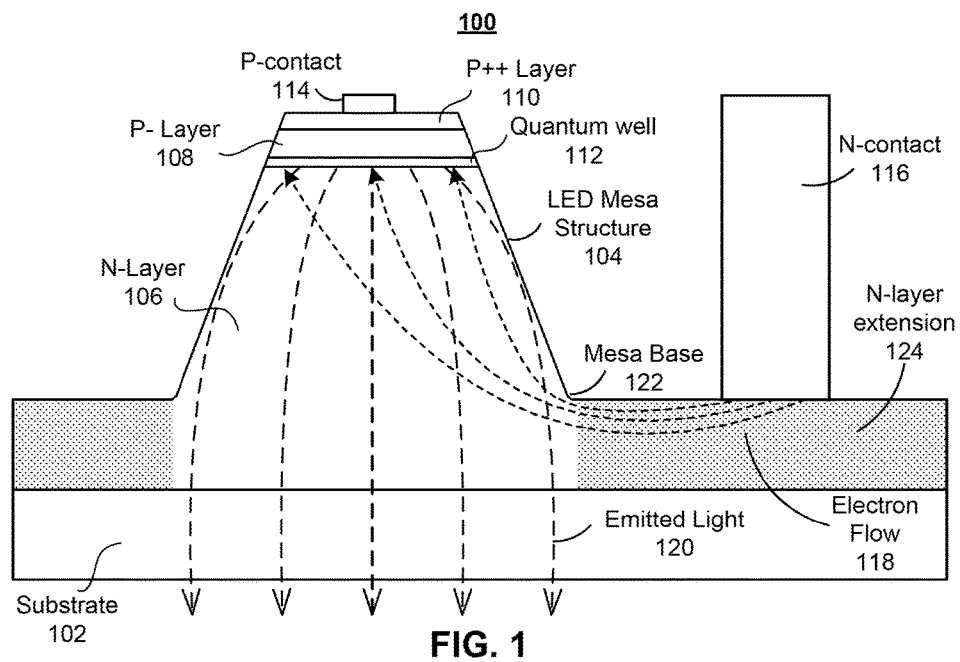
FIG. 1 is a cross sectional diagram of a μLED with a mesa shaped structure.

FIG. 1 is a cross sectional diagram of a conventional bottom-emitting mesa shaped μLED 100. A μLED, or "Micro LED," refers to a particular type of LED having a small active light emitting area (e.g., less than 2,000 μm²). Bottom-emitting μLEDs emit light through a bottom surface of the μLED. The bottom surface typically has an emitting area, which refers herein to an area of the bottom surface through light is emitted during operation of the μLED, and a non-emitting area, which refers herein to an area of the bottom surface through which light is not emitted during operation of the μLED.

During manufacture, the μLED 100 is formed on a substrate 102, such as a sapphire substrate. An LED mesa structure 104 is formed above the substrate 102. The LED mesa structure 104 is made up of several semiconductor layers: an n-layer 106, a p-layer 108, and a p++ layer 110. The n-layer 106 is an n-type semiconductor, such as n-type gallium nitride ("N-GaN"), and the p-layer 108 and p++ layer 110 are a p-type semiconductor, such as p-type gallium nitride ("P-GaN" and "P++ GaN"). The p++ layer 110 has a higher doping concentration than the p-layer 108. In some embodiments, only one p-type layer with a single concentration is used instead of both a p-layer 108 and a p++ layer 110. A quantum well 112 is formed between the p-layer 108 and the n-layer 106. The quantum well emits light when excited by a current.

As shown in FIG. 1, the semiconductor layers 106, 108, and 110 and the quantum well 112 are formed into a semi-parabolic mesa shape 104. The mesa structure 104 has a mesa base 122, which may be circular. The n-type layer 106 extends below the mesa base 122 and around the diameter of the mesa base 122. The extension of the n-layer 106 beyond the diameter of the mesa base 122 is shown as the shaded n-layer extension region 124 in FIG. 1.

A p-contact 114 is formed on the top of the mesa, connecting to the p++ layer 110. An n-contact 116 is formed on the n-layer extension 124 of the n-layer 106. Contact pads can be applied to both the n-contact 116 and the p-contact 114 to connect the μLED 100 to a transistor layer, such as a thin film transistor (TFT) layer (not shown). In addition, the μLED 100 can be removed from the substrate 102 and placed on a transparent layer, such as glass.

During operation of the μLED 100, a voltage difference is applied between the n-contact 116 and the p-contact 114 so that electrons flow from the n-contact 116 towards the p-contact 114. The arrows 118 show the path of the electron flow along the n-layer extension 124 of the n-layer 106 towards the mesa structure 104, and up through the mesa structure 104 to the quantum well 112. Light is emitted from the quantum well 112 and through the n-type semiconductor 106 and the transparent layer. The arrows 120 show the direction of the emitted light.

The mesa structure 104 has a truncated top, on a side opposed to a light transmitting or emitting face of the μLED 100. The mesa 104 has a near-parabolic shape to form a reflective enclosure for light generated within the μLED 100. When the light emitted from the quantum well 112 reflects off of the walls of the mesa structure 104 and/or the p-contact 114, the μLED 100 outputs collimated or quasi-collimated light that has a reduced beam angle compared to light emitted from a standard unfocused LED device. Collimating the light is beneficial because it increases the brightness level of light emitted from the small active light emitting area and prevents the spreading of emitted light into the beampath of other adjacent μLEDs or photodetectors.

As shown in FIG. 1, light is only emitted in the region under the LED mesa structure 104. No light is emitted in the area of the n-layer extension 124, on which the n-contact 116 is formed. When multiple μLEDs 100 are positioned together, the amount of light extracted relative to the size of the bottom surface of the μLEDs 100, and the density of the light-emitting portions of the μLEDs 100, is limited by size of the non-emitting area used for the n-contacts 116 of the μLEDs 100. In addition, the electron flow 118 encounters resistance between the n-contact 116 and the quantum well 112. A lower resistance within the device would improve the operation of the μLED 100.

Figure 2:
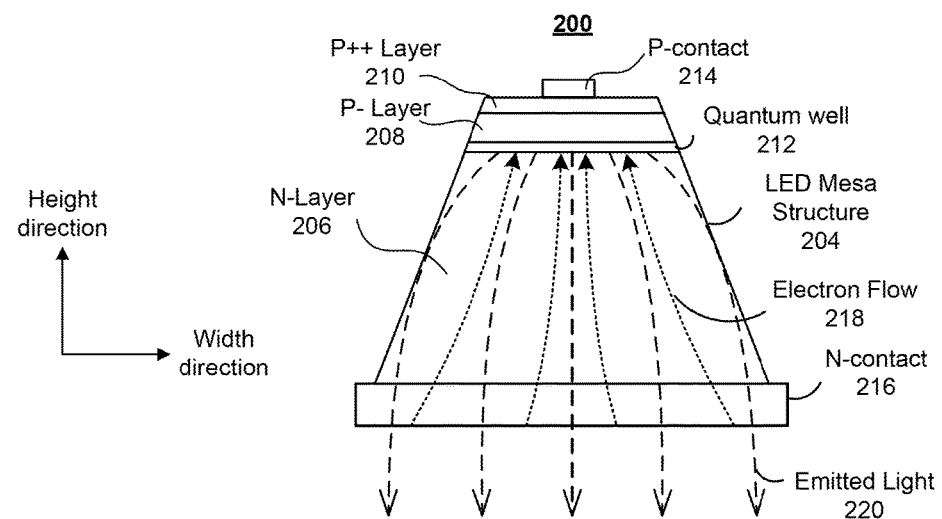
FIG. 2 is a cross sectional diagram of a μLED with electrical contacts at the top and bottom of the structure, according to one embodiment.

FIG. 2 is a cross sectional diagram of a μLED 200 with electrical contacts at the top and bottom of the structure, according to one embodiment. The n-contact in the μLED 200 is at the bottom of the LED mesa structure, rather than to the side of the LED mesa structure, thus eliminating the need to have the n-layer extend beyond the diameter of the mesa structure for forming the n-contact.

The μLED 200 includes an LED mesa structure 204, a p-contact 214 disposed on the top of the LED mesa structure 204, and an n-contact 216 disposed on the bottom of the LED mesa structure 204. The LED mesa structure 204 may include, among other components, an p-layer 206, a p-layer 208, a p++ layer 210, and a quantum well 212. The quantum well 212 emits light when a voltage difference is applied between the p-contact 214 and the n-contact 216, causing a current to pass through the LED mesa structure 204. The arrows 218 show the path of the electron flow from the n-layer 206 to the quantum well 212.

Light is emitted from the quantum well 212 and through the n-layer 206. The arrows 220 show the direction of the emitted light. The elements of the LED mesa structure 204 (i.e., the n-layer 206, the p-layer 208, the p++ layer 210, and the quantum well 212) and the p-contact 214 are similar to the corresponding elements of the LED mesa structure 104 and the p-contact 114 described with respect to FIG. 1. In addition, the LED mesa structure 204 has a similar semi-parabolic shape to the LED mesa structure 104 described with respect to FIG. 1, and the μLED 200 outputs collimated or quasi-collimated light. The base of the LED mesa structure 204 may be circular or oblong. In some embodiments, the LED mesa structure 204 is formed by growing the layers in order from the n-layer 206. In such embodiments, the n-layer 206 is grown first, followed by a quantum well layer 212, the p-layer 208, and the p++ layer 210. The p++ layer 210 is optional, and in some embodiments, additional layers are included, such as an electron blocking layer or a strain release layer. After the layers are grown, the mesa structure 204 is etched.

The n-contact 216 of the μLED 200 is formed directly on the LED mesa structure 204, at the bottom of the mesa. The n-contact 216 is transparent or semi-transparent so that the emitted light 220 can pass through the n-contact 216. For example, the n-contact 216 can be a transparent conductive oxide material that is deposited as a thin film on the bottom of the LED mesa structure 204. Because the n-contact 216 is formed directly on the LED mesa structure 204, the n-layer 206 does not need to extend beyond the diameter of the base of the LED mesa structure 204. Instead, the layers of material in the LED mesa structure 204, including the p-layer 206, are etched all the way through during the shaping of the LED mesa structure 204. This individuates the mesa structure 204 from neighboring mesa structures formed on the same substrate.

Forming the n-contact 216 on the bottom of the LED mesa structure 204 and removing the n-layer extension reduces the size of the bottom surface of the μLED 200 compared to the μLED 100 in FIG. 1. The area of the top and bottom of the n-contact 216 may be the same as the area of the base of the LED mesa structure 204. In other embodiments, the top and bottom area of the n-contact 216 may be somewhat larger than the area of the base of the LED mesa structure 204 (as shown in FIG. 2), or the top and bottom area of the n-contact 216 may be smaller than the area of the base of the LED mesa structure 204 (e.g., the n-contact 216 may only cover a portion of the base of the LED mesa structure 204).

The LED mesa structure 204 is constructed from one or more semiconductor materials, which may include gallium nitride, indium gallium nitride, aluminum gallium phosphide, gallium arsenide, gallium arsenide phosphide, zinc selenide, or any combination of these materials such that a transparent light emitting semiconductor is formed. The LED mesa structure 204 and the p-contact 214 may be initially formed on an epi-wafer or other substrate, which may substantially include one or more of sapphire, gallium nitride, aluminum nitride, gallium arsenide, indium phosphide, gallium phosphide and/or silicon carbide. As described above, the LED mesa structure 204 can be formed growing the layers in order, i.e., by growing the n-layer 206 first, followed by the quantum well layer 212, the p-layer 208, and the p++ layer 210. After the layers are grown, the mesa structure 204 is etched and the p-contact 214 is formed on top of the mesa 204. After the LED mesa structure 204 and the p-contact 214 are formed, the substrate is removed, and the n-contact 216 is formed on the base of the LED mesa structure 204. A method for producing the μLED 200 is described in greater detail with respect to FIG. 5.

In addition to the reduced size of the μLED 200, another advantage to the configuration of the μLED 200 over the μLED 100 is that the resistance between the n-contact 216 and the quantum well 212 (i.e., the resistance in the n-layer 216) of FIG. 2 is less than the resistance between the n-contact 116 and the quantum well 112 (i.e., the resistance in the n-layer 116) of FIG. 1. There are several reasons that the resistance in the n-layer 206 is lower. First, etching the LED mesa structure 104 in the μLED 100 makes the surface of the LED mesa structure 104 near the mesa base 122 rough, which increases the resistivity in the area around the mesa base 122. As shown in FIG. 1, the electron flow 118 travels through this rough, high resistivity area. In FIG. 2, the electron flow 218 travels directly up from the n-contact 216, and most of the electron flow 218 is not close to the edge of the mesa 204. Thus, most of the electron flow 218 is not affected by a high resistance near the mesa base, resulting in a lower resistance in the μLED 200 than in the μLED 100.

Second, the resistivity of the n-type material may vary based on the direction of electron flow. A reference height direction and width direction are shown in FIG. 2. In some semiconductor materials, the electrical resistivity in the height direction is higher than the resistivity in the width direction. Thus, the electron flow 118 in FIG. 1 has high resistance when it moves through the n-layer extension 124 between the n-contact 116 and the LED mesa structure 104. By contrast, the electron flow 218 moves primarily in the lower-resistivity height direction, resulting in an overall lower resistance in the μLED 200 than the μLED 100.

Third, even in the case that the resistivity of the n-layer 106 is the same as the resistivity of the n-layer 206, the distance that the electrons travel between the n-contact 116 and the quantum well 112 in μLED 100 is longer than the distance that the electrons travel between the n-contact 216 and the quantum well 212 in μLED 200, which makes the resistance of the p-layer 106 greater than the resistance of the n-layer 206.

Figure 3:
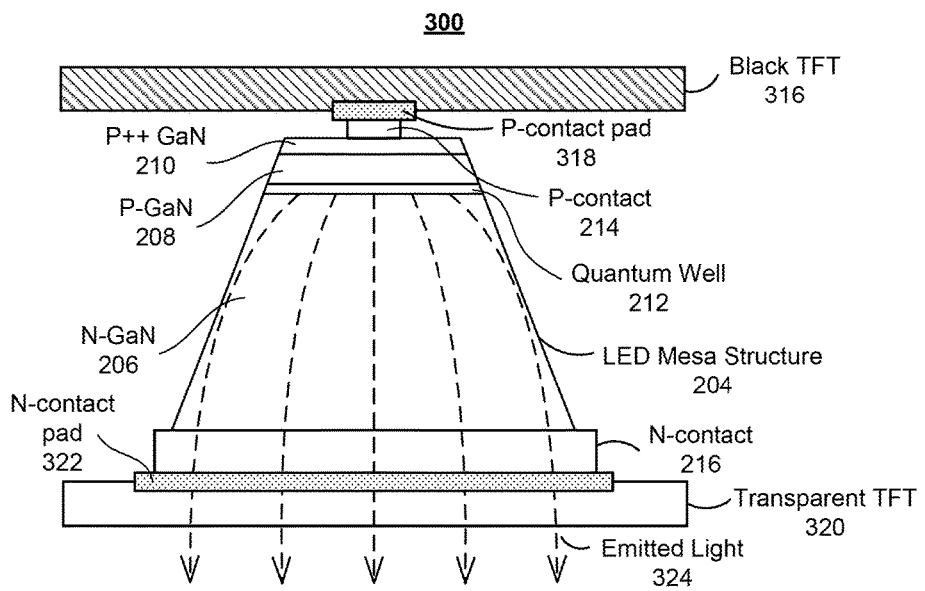
FIG. 3 is a cross sectional diagram of the μLED of FIG. 2 arranged between two circuitry substrates, according to one embodiment.

FIG. 3 is a cross sectional diagram 300 showing the μLED of FIG. 2 arranged between and connected to two circuitry substrates, according to one embodiment. The μLED shown in FIG. 3 has the same components as the μLED 200 in FIG. 2. In particular, FIG. 3 shows the LED mesa structure 204, the p-contact 214 disposed on the top of the LED mesa structure 204, and the n-contact 216 disposed on the bottom of the LED mesa structure 204. The LED mesa structure 204 may include, among other components, the n-layer 206, the p-layer 208, the p++ layer 210, and the quantum well 212. As mentioned above, the p++ layer 210 is optional, and other layers may be included.

FIG. 3 shows the μLED 200 attached to circuitry substrates, which are used to apply voltages to the n-contact 216 and the p-contact 214. The top circuitry substrate is a black thin film transistor (TFT) 316. The bottom circuitry substrate is a transparent TFT 320. TFTs are made by depositing thin films of an active semiconductor layer along with a dielectric layer and metallic contacts over a supporting non-conducting substrate, such as glass. TFT 316 and TFT 320 may include transistors based on amorphous silicon (A-Si), low temperature polysilicon (LTPS), or amorphous Indium Gallium Zinc Oxide (IGZO) technology, among others. The substrate sizes may range from first generation displays of around 30 cm×40 cm to larger displays, such as tenth generation displays (known as GEN 10) of around 2.88 m×3.15 m, GEN 10.5 displays of around 2.94 m×3.37 m, or larger display sizes. In some embodiments, instead of the TFT 316, TFT 320, or both TFTs 316 and 320, a back-plane may be used to connect the electrical contact to a current source.

The p-contact 214 of the μLED 200 is attached to the black TFT 316 via a p-contact pad 318. The n-contact 216 of the μLED 200 is attached to the transparent TFT 320 via an n-contact pad 322. The contact pads 318 and 322 are made of a conductive material. The contact pads 318 and 322 may be formed on the μLED 200, or the contact pads 318 and 322 may be formed on their respective TFTs 316 and 320. A bonding element may be used to connect the contact pads 318 and 322 to the respective TFTs 316 and 320.

In prior μLED assemblies, such as an assembly of the μLEDs 100 in FIG. 1, the density at which the μLEDs could be arranged was limited not only by the prior arrangement of the n-contact next to the mesa, but also by the density of transistors in the TFT layer. In such prior assemblies, each μLED needed two transistors in the TFT layer—one for the n-contact 116, and one for the p-contact 114. By contrast, an assembly of the μLEDs 200 has two TFT layers—one below the n-contacts 216, and one above the p-contacts 214—and each TFT layer only includes transistor per μLED 200. Because half as many transistors are needed on the TFT layer, the μLEDs 200 can be placed with higher density.

Figure 4:
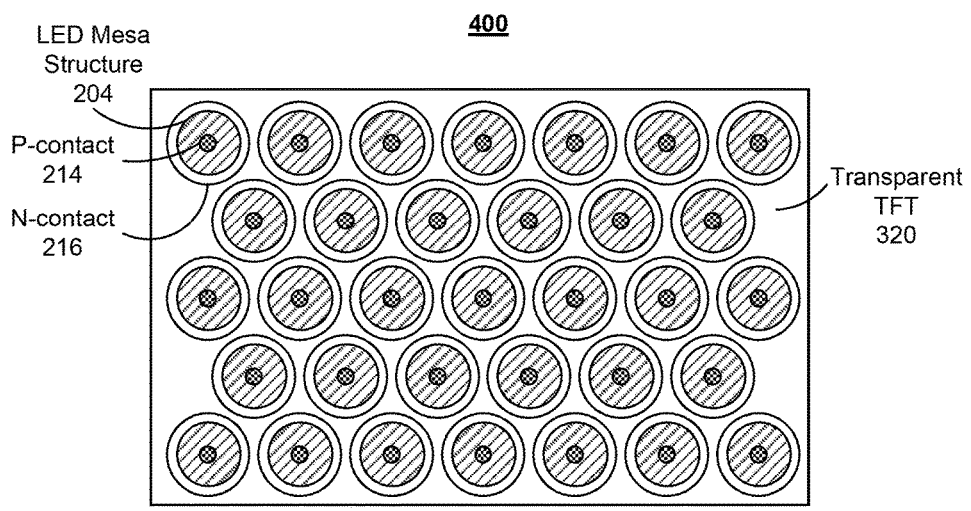
FIG. 4 is a top view of an assembly of the μLEDs of FIG. 2, according to one embodiment.

FIG. 4 is a top view of an assembly 400 of the μLEDs of FIG. 2, according to one embodiment. The assembly shows an arrangement of multiple μLEDs 200 arranged on the transparent TFT 320. The p-contact 214, LED mesa structure 204, and n-contact 216 of each μLED 200 are shown. The LED mesa structures 204 are shaded with diagonal lines, and the p-contacts 216 are shaded in a checkerboard pattern. P-contact pads 318 and the black TFT 316 (not shown) would be arranged on top of the assembly 400. The μLEDs 200 in assembly 400 are packed close together, with little distance between the μLEDs. This results in a dense display with a high emission. An assembled wafer can be fully populated, without losing space on the wafer to non-emitting areas for n-contacts.

Figure 5:
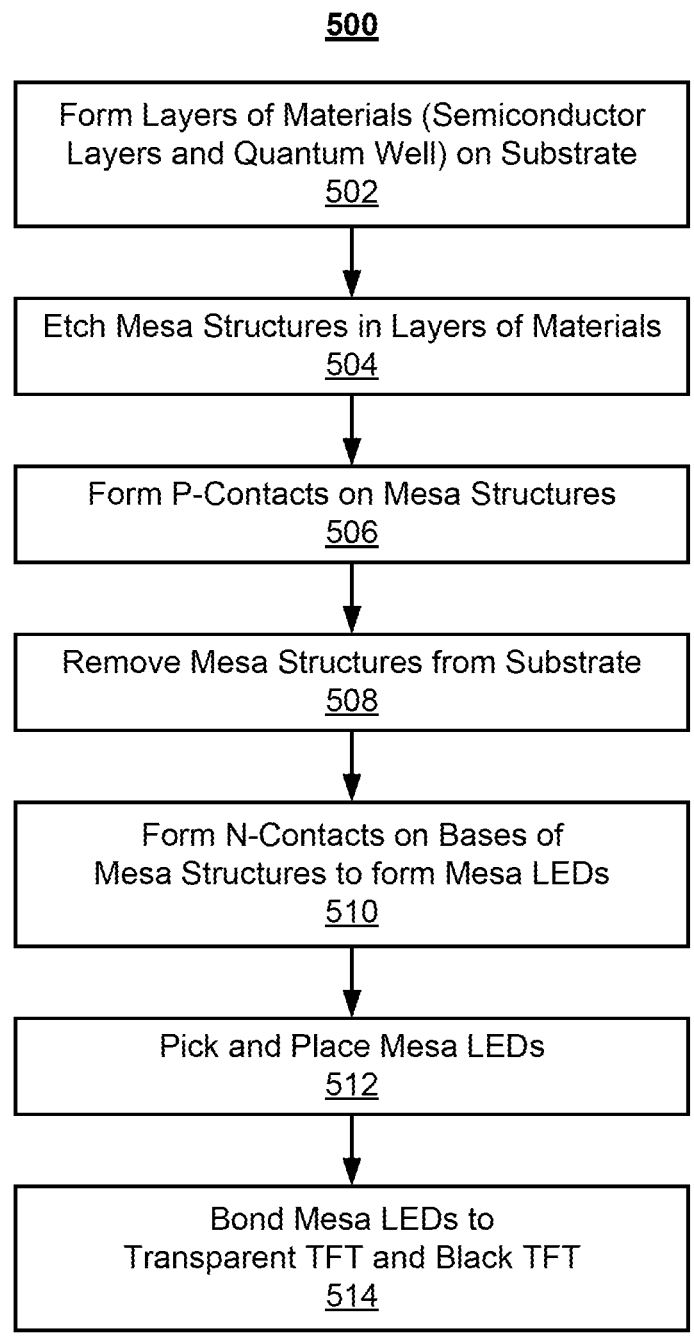
FIG. 5 is a flowchart illustrating the process for generating an assembly of μLEDs with top and bottom electrical contacts, according to one embodiment.

FIG. 5 is a process 500 for generating an assembly of μLEDs with top and bottom electrical contacts, according to one embodiment.

Layers of semiconductor material and a quantum well are formed 502 on a substrate. For example, the layers may include an n-layer 206, a p-layer 208, a p++ layer 210, and a quantum well 212 between the n-layer 206 and the p-layer 208. In some embodiments, there is a single p-layer rather than both a p-layer 208 and a p++ layer 210. The semiconductor layers may include one or more of gallium nitride, indium gallium nitride, aluminum gallium phosphide, gallium arsenide, gallium arsenide phosphide, zinc selenide, or any combination of these materials such that a transparent light emitting semiconductor is formed. The substrate may substantially include one or more of sapphire, gallium nitride, aluminum nitride, gallium arsenide, indium phosphide, gallium phosphide and/or silicon carbide.

The layers of materials on the substrate are etched 504 into mesa structures. The etching may be performed using standard LED fabrication techniques. The layers of material may be etched through to the substrate. If multiple mesa structures are etched into the layers of materials, etching the layers through to the substrate individuates each mesa.

P-contacts are formed 506 on the mesa structures using standard LED fabrication techniques involving, for example, photolithograhy. In some embodiments, the p-contacts are formed 506 on the layers of material before the mesa structures are etched 504 into the layers of material. In other embodiments, the p-contacts are not formed 506 on the mesa structure, and instead are deposited on the black TFT and applied to the tops of the mesas when the mesa structures are placed onto the TFTs.

The mesa structures with the p-contacts are removed 508 from the substrate. For example, a laser lift-off (LLO) process can be applied to the GaN mesa structures to remove them from a sapphire substrate. LLO involves removing the substrate using a laser beam, such as an ultraviolet (UV) beam. The laser beam is directed through the substrate to the n-layer of the mesa structure, which causes the mesa structure to separate from the substrate. Other processes can be used to remove the mesa structure from the substrate, depending on the materials used; for example, an etch stop layer (ESL) can be deposited onto a substrate to separate the substrate from the mesa structure. In other embodiments, wet etching, dry etching, mechanical release, or thermal release techniques can be used to remove the mesa structure from the substrate.

In some embodiments, any or all of steps 502, 504, 506, and 508 are performed according to the techniques for forming a mesa-shaped μLED described in U.S. Pat. No. 7,598,149, which is incorporated herein by reference.

N-contacts are formed 510 on the bases of the mesa structures, forming mesa LEDs. The n-contacts may be a made of a transparent oxide material that is deposited to the bottom of the mesa structures as a thin film. In some embodiments, the n-contacts are formed on the transparent TFT, and applied to the bases of the mesa structures when the mesa structures are placed onto the transparent TFT.

The mesa LEDs are picked and placed 512 onto the transparent and black TFTs. In particular, the p-contacts on the mesa LEDs can be aligned with the contact pads on the black TFT, and the n-contacts on the mesa LEDs can be aligned with the contact pads on the transparent TFT.

The mesa LEDs are bonded 514 to the transparent and black TFTs, e.g., using thermocompression bonding.

Figure 6:
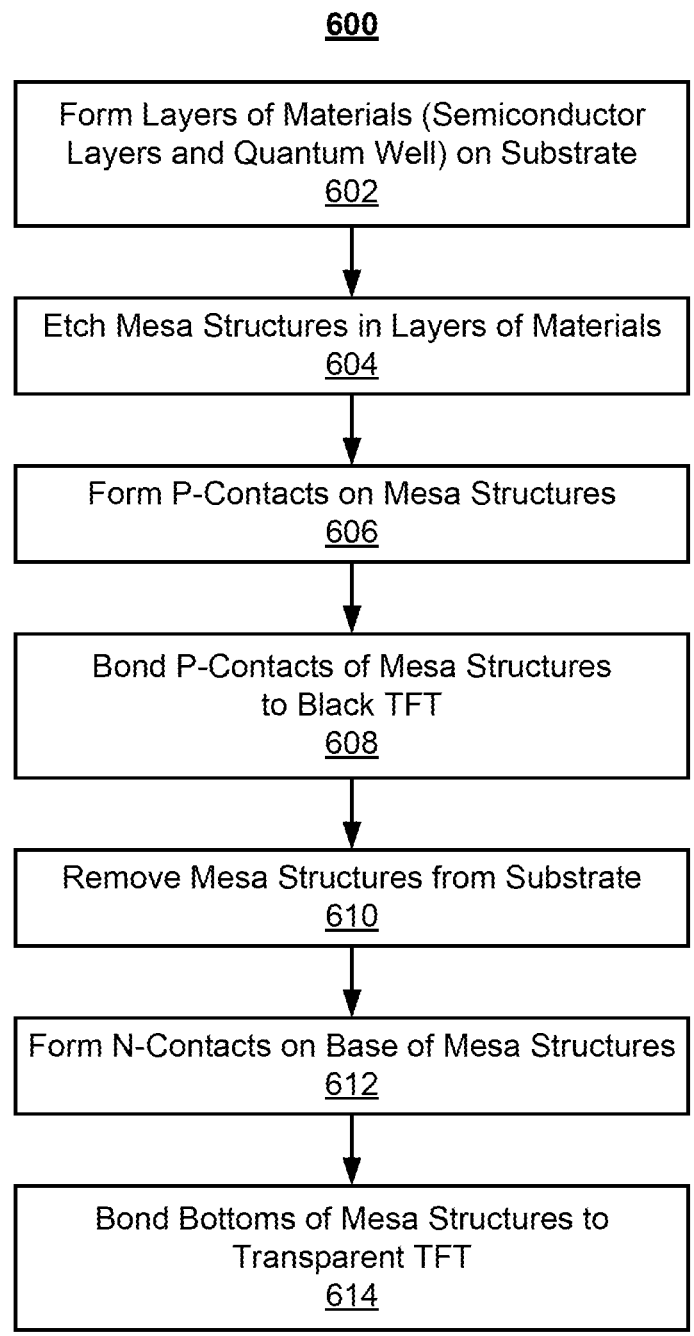
FIG. 6 is a flowchart illustrating another process for generating an assembly of μLEDs with top and bottom electrical contacts, according to one embodiment.

FIG. 6 is a process 600 for generating an assembly of μLEDs with top and bottom electrical contacts, according to another embodiment.

Layers of semiconductor material and a quantum well are formed 602 on a substrate. The layers of semiconductor material and quantum well may be formed 602 according to techniques described above in reference to the forming 502 in FIG. 5.

The layers of materials on the substrate are etched 604 into mesa structures, in a manner similar to the etching 504 described above in reference to FIG. 5.

P-contacts are formed 606 on the mesa structures in a manner similar to the p-contact formation 506 described above in reference to FIG. 5.

The p-contacts of the mesa structures are then bonded 608 to the black TFT, while the mesa structures are still attached to the substrate. In some embodiments, rather than forming 606 the p-contacts on the mesa structures, the p-contacts are formed on the black TFT and attached to the mesa structures during the bonding 608.

After the mesa structures are bonded to the black TFT, the mesa structures are removed 610 from the substrate. For example, laser lift-off, wet etching, dry etching, an etch stop layer, mechanical release, or thermal release techniques can be used to remove the mesa structure from the substrate.

N-contacts are formed 612 on the bases of the mesa structures. The n-contacts may be a made of a transparent oxide material that is deposited to the bottom of the mesa structures as a thin film. In some embodiments, the n-contacts are formed on the transparent TFT instead of the mesa structures.

The bottoms of the mesa structures are bonded 614 onto the transparent TFT. If the n-contacts were formed 612 on the bases of the mesa structures, the n-contacts can be aligned with the contact pads on the transparent TFT and bonded using, e.g., thermocompression bonding. Alternatively, if the n-contacts were formed on the transparent TFT, the bases of the mesa structures are bonded to the n-contacts on the transparent TFT, both forming the n-contact on the base of the mesa structure and bonding the mesa structures to the transparent TFT. In some embodiments, the metal bond pads on the transparent TFT create the n-contact when bonded to the mesa structures.

While the above embodiments were described with reference to a μLED having a p-contact at the top, a p-type region below the p-contact, an n-type region below the p-contact, and an n-contact at the bottom of the μLED, it should be understood that the polarity of the p-region and the n-region can be reversed, such that the upper portion of the mesa is an n-type material, and the lower portion of the mesa is a p-type material. In such embodiments, the top contact of the μLED is an n-contact, and the bottom contact of the μLED is a p-contact.

Upon reading this disclosure, a reader will appreciate still additional alternative structural and functional designs through the disclosed principles herein. Thus, while particular embodiments and applications have been illustrated and described, it is to be understood that the disclosed embodiments are not limited to the precise construction and components disclosed herein. Various modifications, changes and variations, which will be apparent to those skilled in the art, may be made in the arrangement, operation and details of the method and apparatus disclosed herein without departing from the spirit and scope defined in the appended claims.

What is claimed is:

1. A method for fabricating a light emitting diode (LED), the method comprising:
   forming layers of materials on a substrate, the layers of materials including a first semiconductor layer, a second semiconductor layer, and a light emitting layer between the first and second semiconductor layers for producing light responsive to passing current through the light emitting layer;
   shaping the formed layers of material into at least one semiconductor structure;
   forming a first electrical contact on a top of the semiconductor structure;
   removing the semiconductor structure from the substrate;
   forming a second electrical contact at a bottom of the semiconductor structure, wherein the second electrical contact is at least partially transparent;
   connecting the first electrical contact to a contact pad on a first circuitry substrate; and
   connecting the second electrical contact to another contact pad on a second circuitry substrate.

2. The method of claim 1, further comprising:
   aligning the semiconductor structure to the first circuitry substrate; and
   aligning the semiconductor structure to the second circuitry substrate.

3. The method of claim 1, wherein the second circuitry substrate is transparent.

4. The method of claim 1, wherein forming the first electrical contact on top of the semiconductor structure comprises:
   forming the first electrical contact on the first circuitry substrate; and
   bonding the first electrical contact on the first circuitry substrate to the top of the semiconductor structure to form the first electrical contact on top of the semiconductor structure.

5. The method of claim 1, wherein forming the second electrical contact at the bottom of the semiconductor structure comprises:
   forming the second first electrical contact on the second circuitry substrate; and
   bonding the second electrical contact on the second circuitry substrate to the bottom of the semiconductor structure to form the second electrical contact at the bottom of the semiconductor structure.

6. The method of claim 1, wherein the second electrical contact comprises a transparent conductive oxide material.

7. The method of claim 6, wherein forming the second electrical contact at the bottom of the semiconductor structure comprises depositing the transparent conductive oxide material as a thin film on the bottom of the semiconductor structure.

8. The method of claim 1, wherein shaping the formed layers of material comprises etching the layers of materials into a mesa, the first electrical contact formed on a top of the mesa.

9. The method of claim 8, wherein the layers of material are etched through during the shaping of the formed layers to individuate the at least one semiconductor structure.

10. The method of claim 1, wherein the first semiconductor layer has a first electrical resistivity along a direction of height and a second electrical resistivity in a direction perpendicular to the direction of height, the first electrical resistivity lower than the second electrical resistivity.

11. A light emitting diode (LED) assembly comprising:
    a semiconductor structure comprising:
       a first semiconductor layer,
       a second semiconductor layer, and
       a light emitting layer between the first semiconductor layer and the second semiconductor layer for producing light responsive to passing current through the light emitting layer;
    a first electrical contact on a top surface of the semiconductor structure;
    a second electrical contact on a bottom surface of the semiconductor structure, the second electrical contact being at least partially transparent;
    a first circuitry substrate having a first contact pad connected to the first electrical contact; and
    a second circuitry substrate having a second contact pad connected to the second electrical contact.

12. The LED of claim 11, wherein the semiconductor structure has a mesa shape.

13. The LED of claim 11, wherein the second electrical contact extends across the bottom surface of the semiconductor structure.

14. The LED of claim 13, wherein the second electrical contact is a transparent thin film conducting oxide.

15. The LED of claim 11, wherein the first electrical contact is made of non-transparent metal.

16. The LED of claim 11, wherein the first semiconductor layer has a first electrical resistivity along a direction of height and a second electrical resistivity in a direction perpendicular to the direction of height, the first electrical resistivity lower than the second electrical resistivity.

17. The LED of claim 11, wherein the bottom of the semiconductor structure has a circular shape.

18. The LED assembly of claim 11, wherein the second circuitry substrate is transparent.

19. A light emitting diode (LED) assembly wafer comprising:
    a plurality of LEDs, each LED of the plurality of LEDs comprising:
       a semiconductor structure comprising:
          a first semiconductor layer,
          a second semiconductor layer, and
          a light emitting layer between the first semiconductor layer and the second semiconductor layer for producing light responsive to passing current through the light emitting layer;
       a first electrical contact on a top surface of the semiconductor structure; and
       a second electrical contact on a bottom surface of the semiconductor structure, the second electrical contact being at least partially transparent;
    a first substrate having first contacts pads, each of the first contact pads connected to a respective one of the first electrical contacts of the plurality of LEDs; and
    a second substrate having second contact pads, each of the second contact pads connected to a respective one of the second electrical contacts of the plurality of LEDs.

20. The LED assembly wafer of claim 19, wherein the semiconductor structure of each of the plurality of LEDs has a mesa shape.

* * * * *

UNITED STATES PATENT AND TRADEMARK OFFICE
CERTIFICATE OF CORRECTION

Page 1 of 1

PATENT NO. : 10,020,422 B1
APPLICATION NO. : 15/721417
DATED : July 10, 2018
INVENTOR(S) : Celine Claire Oyer It is certified that error appears in the above-identified patent and that said Letters Patent is hereby corrected as shown below:

In the Claims

Column 9, Line 41, after "second" delete "first".

Signed and Sealed this
Twenty-sixth Day of February, 2019

Andrei Iancu
*Director of the United States Patent and Trademark Office*